US012721146B2

(12) United States Patent
Wu

(10) Patent No.: US 12,721,146 B2
(45) Date of Patent: Aug. 25, 2026

(54) SEMICONDUCTOR DEVICE AND METHOD OF MANUFACTURING THE SAME

(71) Applicant: NANYA TECHNOLOGY CORPORATION, New Taipei city (TW)

(72) Inventor: Chun-Heng Wu, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 398 days.

(21) Appl. No.: 18/518,415

(22) Filed: Nov. 22, 2023

(65) Prior Publication Data

US 2025/0167105 A1 May 22, 2025

(51) Int. Cl.
*H01L 23/522* (2006.01)
*H10W 20/00* (2026.01)
*H10W 20/42* (2026.01)

(52) U.S. Cl.
CPC ......... *H10W 20/42* (2026.01); *H10W 20/033* (2026.01); *H10W 20/056* (2026.01); *H10W 20/082* (2026.01)

(58) Field of Classification Search
CPC . H10W 20/42; H10W 20/033; H10W 20/056; H10W 20/082; H10B 12/37; H10B 12/30; H10B 12/03–0387; H10D 1/047; H10D 1/665; H10D 1/60–716
See application file for complete search history.

(56) References Cited

U.S. PATENT DOCUMENTS 8,815,697 B2 * 8/2014 Yoon ...................... H10D 1/716 438/396
2021/0013210 A1 * 1/2021 Lee ........................ H10B 12/50

* cited by examiner

*Primary Examiner* — Cuong B Nguyen
(74) *Attorney, Agent, or Firm* — CKC & Partners Co., LLC

(57) ABSTRACT

A semiconductor device includes a landing pad, a first nitride layer, a first oxide layer, a second nitride layer, a third nitride layer, an electrode layer, and a filling material. The landing pad, the first nitride layer, the first oxide layer, the second nitride layer, and the third nitride layer are sequentially formed. A trench runs through the third nitride layer, the second oxide layer, the second nitride layer, the first oxide layer, and the first nitride layer. The electrode layer is disposed on an inner sidewall of the trench, a top surface of the third nitride layer, and a top surface and a sidewall of the landing pad. The filling material is filled in the trench and contacts the landing pad by the electrode layer.

11 Claims, 11 Drawing Sheets

M

SEMICONDUCTOR DEVICE AND METHOD OF MANUFACTURING THE SAME

BACKGROUND

Field of Invention

The present invention relates to a semiconductor device and a method of manufacturing the same.

Description of Related Art

With the evolution of generations of semiconductor processes, there will be challenges of trench forming process. For example, the trenches in semiconductor structure of Dynamic random-access memory (DRAM) are preferably manufactured with a high aspect ratio. However, since the nitride layer has greater etching resistivity, a shrinkage problem may occur within a portion of the trench through the nitride layer, thereby causing a high resistance between the electrode layer and the landing pad formed in the subsequent processes.

SUMMARY

In view of this, one purpose of the present disclosure is to provide a semiconductor device and a method of manufacturing the same can solve the aforementioned problems.

In order to achieve the above objective, according to an embodiment of the present disclosure, a semiconductor device includes a landing pad, a first nitride layer, a first oxide layer, a second nitride layer, a second oxide layer, a third nitride layer, an electrode layer, and a filling material. The first nitride layer is disposed over the landing pad. The first oxide layer is disposed on the first nitride layer. The second nitride layer is disposed on the first oxide layer. The second oxide layer is disposed on the second nitride layer. The third nitride layer is disposed on the second oxide layer. A trench runs through the third nitride layer, the second oxide layer, the second nitride layer, the first oxide layer, and the first nitride layer. The trench further has an expanding portion through the first nitride layer. A width of a top of the expanding portion of the trench is equal to or greater than a width of a top of the trench. The electrode layer is disposed on an inner sidewall of the trench, a top surface of the third nitride layer, and a top surface and a sidewall of the landing pad. The filling material is filled in the trench and contacts the landing pad by the electrode layer.

In one or more embodiments of the present disclosure, the filling material contacts the top surface and the sidewall of the landing pad by the electrode layer.

In one or more embodiments of the present disclosure, the expanding portion of the trench is located over the landing pad.

In one or more embodiments of the present disclosure, a width of the expanding portion of the trench tapers downward from a top surface of the first nitride layer to a top surface of the landing pad.

In one or more embodiments of the present disclosure, the width of the top of the expanding portion of the trench is greater than a width of a bottom of the expanding portion of the trench.

In one or more embodiments of the present disclosure, the width of the top of the expanding portion of the trench is greater than the width of the top of the trench.

In one or more embodiments of the present disclosure, a height from a top surface of the first nitride layer to a top surface of the landing pad is in a range between 20 nanometers and 25 nanometers.

In one or more embodiments of the present disclosure, the first oxide layer includes borophosphosilicate glass.

In one or more embodiments of the present disclosure, the second oxide layer includes tetraethyl orthosilicate.

In order to achieve the above objective, according to an embodiment of the present disclosure, a method of manufacturing a semiconductor device includes: sequentially forming a landing pad, a first nitride layer, a first oxide layer, a second nitride layer, a second oxide layer, and a third nitride layer; forming a trench running through the third nitride layer, the second oxide layer, the second nitride layer, and the first oxide layer; depositing a protective liner layer on surfaces of the first nitride layer, the second nitride layer, and the third nitride layer; punching through the first nitride layer and exposing the landing pad; etching the first nitride layer and exposing a sidewall of the landing pad; removing the protective liner layer; depositing an electrode layer on an inner surface of the trench and the top surface of the third nitride layer; and depositing a filling material to fill the trench.

In one or more embodiments of the present disclosure, forming the trench is performed such that the first nitride layer is exposed.

In one or more embodiments of the present disclosure, depositing the protective liner layer are performed such that the protective liner layer contacts a top surface of the first nitride layer.

In one or more embodiments of the present disclosure, punching through the first nitride layer and exposing the landing pad are performed such that a portion of the protective liner layer on a top surface of the first nitride layer and a portion of the protective liner layer on a top surface of the third nitride layer are removed.

In one or more embodiments of the present disclosure, etching the first nitride layer and exposing the sidewall of the landing pad are performed after punching through the first nitride layer and exposing the landing pad.

In one or more embodiments of the present disclosure, etching the first nitride layer and exposing the sidewall of the landing pad are performed such that an expanding portion of the trench is formed, and wherein the expanding portion of the trench runs through the first nitride layer.

In one or more embodiments of the present disclosure, etching the first nitride layer and exposing the sidewall of the landing pad are performed such that the expanding portion of the trench is connected between the landing pad and a top surface of the first nitride layer.

In one or more embodiments of the present disclosure, etching the first nitride layer and exposing the sidewall of the landing pad are performed such that a width of a top of the expanding portion of the trench is greater than a width of a bottom of the expanding portion of the trench.

In one or more embodiments of the present disclosure, etching the first nitride layer and exposing the sidewall of the landing pad are performed such that the width of the top of the expanding portion of the trench is equal to or greater than a width of a top of the trench.

In one or more embodiments of the present disclosure, depositing the electrode layer is performed such that the electrode layer contacts a top surface and a sidewall of the landing pad.

In one or more embodiments of the present disclosure, a thickness of the protective liner layer is equal to or greater than 2 nanometers. The protective liner layer includes silicon oxynitride.

In summary, in the semiconductor device and the method of manufacturing the same of the present disclosure, since the protective liner layer lines the inner sidewall of the trench, the critical dimension of the trench does not ream after the step of punching the first nitride layer. In the semiconductor device and the method of manufacturing the same of the present disclosure, since merely a portion of the protective liner layer on the top surface of the first nitride layer is removed, only the width of the bottom of the trench increases as the steps of etching the first nitride layer and exposing the sidewall of the landing pad are performed in the semiconductor device and the method of manufacturing the same of the present disclosure, since the trench has the expanding portion when performing the etching the first nitride layer and exposing the sidewall of the landing pad, the contact area between the electrode layer and the landing pad may be increased, thereby lowering the electric resistance between the electrode layer and the landing pad. Overall, the method of manufacturing the semiconductor device of the present disclosure improves the electrical performance of the entire semiconductor device.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
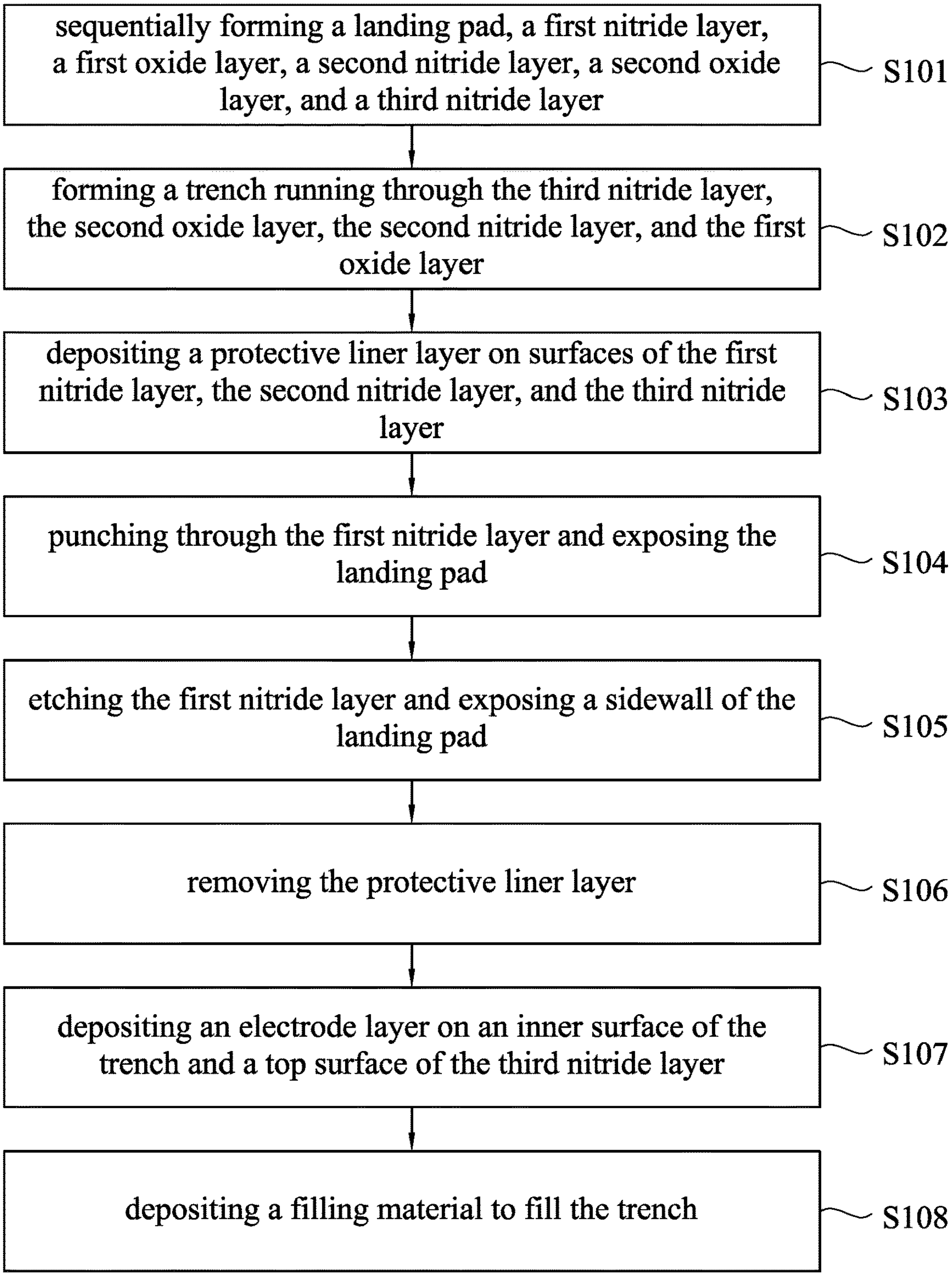
FIG. 1 is a flow chart of a method of manufacturing a semiconductor device in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, “around,” “about,” “approximately,” or “substantially” shall generally mean within 20 percent, or within 10 percent, or within 5 percent of a given value or range. Numerical quantities given herein are approximate, meaning that the term “around,” “about,” “approximately,” or “substantially” can be inferred if not expressly stated.

Reference is made to FIG. 1. FIG. 1 is a flow chart of a method M of manufacturing a semiconductor device 100 as shown in FIG. 8 in accordance with an embodiment of the present disclosure. The method M shown in FIG. 1 includes a step S101, a step S102, a step S103, a step S104, a step S105, a step S106, a step S107, and step S108. Please refer to FIG. 1 and FIG. 2 for better understanding the step S101 and the step S102, refer to FIG. 1 and FIG. 3 for better understanding the step S103, refer to FIG. 1 and FIG. 4 for better understanding the step S104, refer to FIG. 1 and FIG. 5 for better understanding the step S105, refer to FIG. 1 and FIG. 6 for better understanding the step S106, refer to FIG. 1 and FIG. 7 for better understanding the step S107, and refer to FIG. 1, FIG. 8, FIG. 9, FIG. 10, and FIG. 11 for better understanding the step S108.

Step S101, step S102, step S103, step S104, step S105, step S106, step S107, and S108 are described in detail below.

In step S101, a landing pad 110, a first nitride layer 120, a first oxide layer 130, a second nitride layer 140, a second oxide layer 150, and a third nitride layer 160 are sequentially formed.

Figure 2:
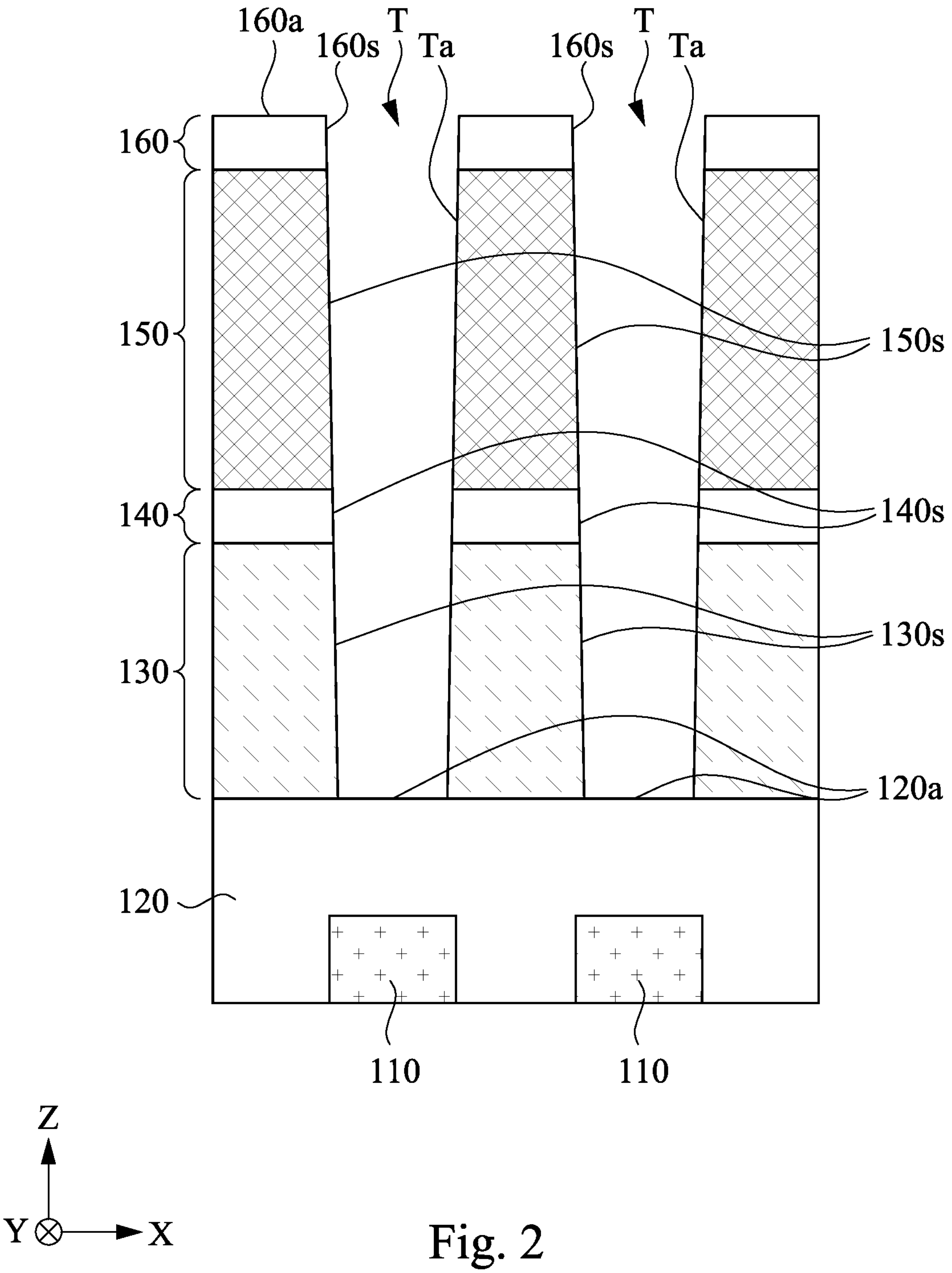
FIG. 2 is a cross-sectional view of an intermediate stage of manufacturing the semiconductor device in accordance with an embodiment of the present disclosure.

Reference is made to FIG. 1 and FIG. 2. FIG. 2 is a cross-sectional view of an intermediate stage of manufacturing a semiconductor device 100 in accordance with an embodiment of the present disclosure. In this embodiment, a landing pad 110, a first nitride layer 120, a first oxide layer 130, a second nitride layer 140, a second oxide layer 150, and a third nitride layer 160 are sequentially formed. In some embodiments, the landing pad 110, the first nitride layer 120, the first oxide layer 130, the second nitride layer 140, the second oxide layer 150, and the third nitride layer 160 are formed along z-direction shown in FIG. 2. More specifically, the first nitride layer 120 is disposed over the landing pad 110. In some embodiments, the first nitride layer 120 covers the landing pad 110. In some embodiments, the first nitride layer 120 at least covers a top surface and side surfaces of the landing pad 110. The first oxide layer 130 is disposed on the first nitride layer 120. The second nitride layer 140 is disposed on the first oxide layer 130. The second oxide layer 150 is disposed on the second nitride layer 140. The third nitride layer 160 disposed on the second oxide layer 150. As shown in FIG. 2, the third nitride layer 160 has a top surface 160*a*.

In some embodiments, the landing pad 110 may be conductive material. In some embodiments, the landing pad 110 may be metallic material. In some embodiments, the landing pad 110 may include a material, such as tungsten (W), or the like. However, any suitable material may be utilized.

In some embodiments, the landing pad 110 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electro-chemical plating), electroless plating, or the like. The present disclosure is not intended to limit the methods of forming the landing pad 110.

In some embodiments, the first nitride layer 120 may be nitride material. In some embodiments, the first nitride layer 120 may include a material, such as silicon nitride (SixNy), or the like. However, any suitable material may be utilized.

In some embodiments, the first nitride layer 120 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electro-chemical plating), electroless plating, or the like. The present disclosure is not intended to limit the methods of forming the first nitride layer 120.

In some embodiments, the first oxide layer 130 may be oxide material. In some embodiments, the first oxide layer 130 may include a material, such as borophosphosilicate glass (BPSG), or the like. However, any suitable material may be utilized.

In some embodiments, the first oxide layer 130 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electro-chemical plating), electroless plating, or the like. The present disclosure is not intended to limit the methods of forming the first oxide layer 130.

In some embodiments, the second nitride layer 140 may be nitride material. In some embodiments, the second nitride layer 140 may include a material, such as silicon nitride ($Si_xN_y$), or the like. However, any suitable material may be utilized.

In some embodiments, the second nitride layer 140 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electro-chemical plating), electroless plating, or the like. The present disclosure is not intended to limit the methods of forming the second nitride layer 140.

In some embodiments, the second oxide layer 150 may be oxide material. In some embodiments, the second oxide layer 150 may include a material, such as tetraethyl orthosilicate (TEOS), or the like. However, any suitable material may be utilized.

In some embodiments, the second oxide layer 150 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electro-chemical plating), electroless plating, or the like. The present disclosure is not intended to limit the methods of forming the second oxide layer 150.

In some embodiments, the third nitride layer 160 may be nitride material. In some embodiments, the third nitride layer 160 may include a material, such as silicon nitride ($Si_xN_y$), or the like. However, any suitable material may be utilized.

In some embodiments, the third nitride layer 160 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electro-chemical plating), electroless plating, or the like. The present disclosure is not intended to limit the methods of forming the third nitride layer 160.

In step S102, a trench T is formed.

Reference is made again to FIG. 1 and FIG. 2. As shown in FIG. 2, in this embodiment, the trench T is formed from the top surface 160*a* of the third nitride layer 160. In some embodiments, the trench T is formed such that the first nitride layer 120 is exposed. In some embodiments, the trench T runs through the third nitride layer 160, the second oxide layer 150, the second nitride layer 140, and the first oxide layer 130. In some embodiments, step S102 is performed such that the trench T is located over the landing pad 110. As shown in FIG. 2, the first nitride layer 120 has a top surface 120*a*. In some embodiments, the trench T is formed such that the top surface 120*a* of the first nitride layer 120 is exposed. In some embodiments, step S102 is performed such that a bottom of the trench T is leveled with the top surface 120*a* of the first nitride layer 120. As shown in FIG. 2, the trench T has an inner surface Ta, and the inner surface Ta includes a side surface 130*s* of the first oxide layer 130, a side surface 140*s* of the second nitride layer 140, a side surface 150*s* of the second oxide layer 150, and a side surface 160*s* of the third nitride layer 160.

In some embodiments, the trench T may be formed by any suitable method, for example, dry etching, or the like. The present disclosure is not intended to limit the methods of forming the trench T.

In step S103, a protective liner layer 170 is formed.

Figure 3:
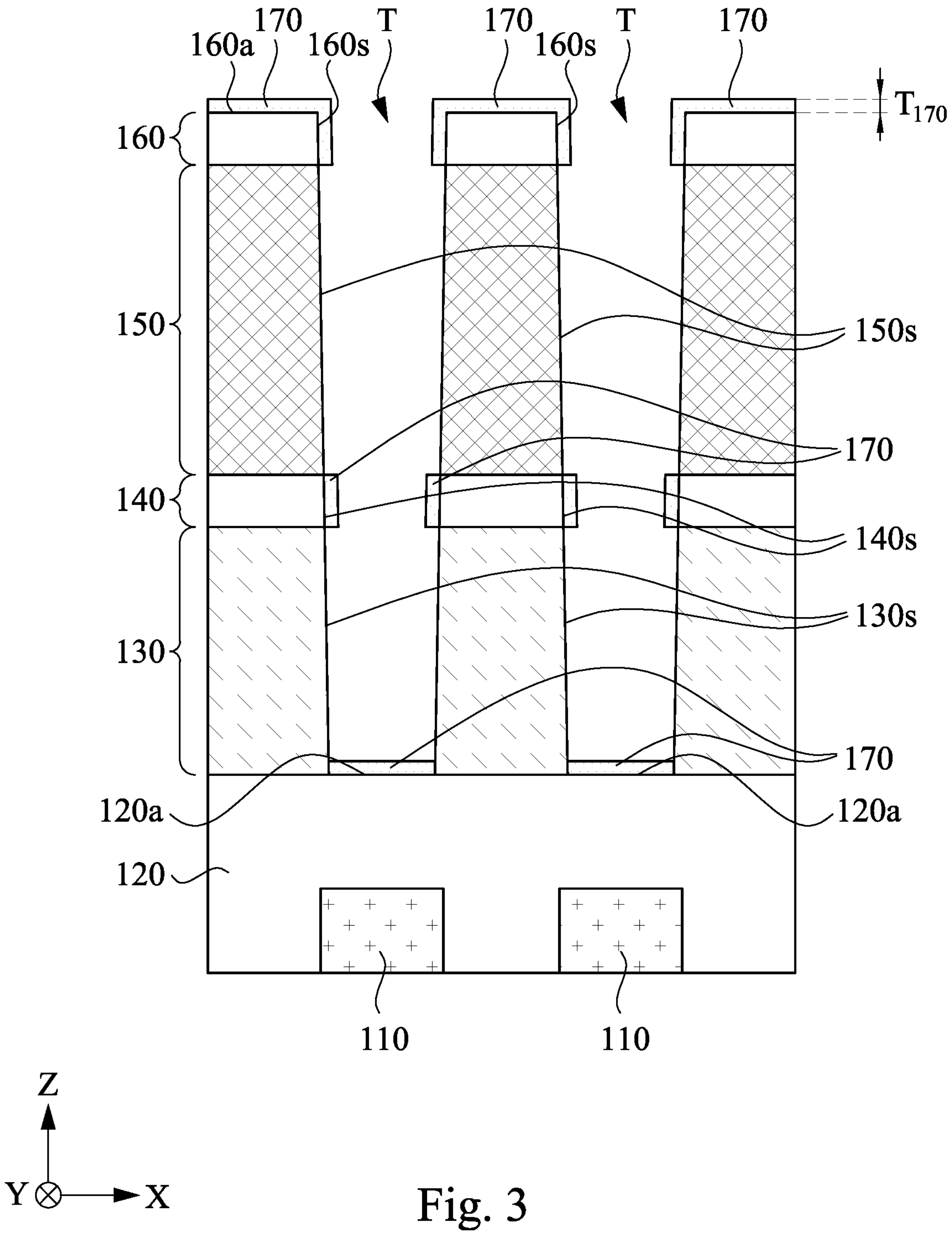
FIG. 3 is a cross-sectional view of an intermediate stage of manufacturing the semiconductor device in accordance with an embodiment of the present disclosure.

Reference is made to FIG. 1 and FIG. 3. FIG. 3 is a cross-sectional view of an intermediate stage of manufacturing the semiconductor device 100 in accordance with an embodiment of the present disclosure. As shown in FIG. 3, the protective liner layer 170 is disposed on the third nitride layer 160. In some embodiments, the protective liner layer 170 lines the trench T. In some embodiments, the protective liner layer 170 is deposited on surfaces of the first nitride layer 120, the second nitride layer 140, and the third nitride layer 160. More specifically, the protective liner layer 170 is deposited on the top surface 160*a* and the side surface 160*s* of the third nitride layer 160, the side surface 140*s* of the second nitride layer 140, and the top surface 120*a* of the first nitride layer 120 due to different chemical characteristics among the oxide layers and nitride layers. In some embodiments, the protective liner layer 170 is performed such that the protective liner layer 170 contacts the top surface 120*a* of the first nitride layer 120.

In some embodiments, the protective liner layer 170 has a thickness $T_{170}$. In some embodiments, the thickness $T_{170}$ of the protective liner layer 170 is equal to or greater than about 2 nanometers (nm), but the present disclosure is not limited thereto. In some embodiment in which the thickness $T_{170}$ of the protective liner layer 170 is less than about 2 nanometers, the trench T may not able to resist etching processes in subsequent step, thereby causing the deterioration of the quality of the trench T.

In some embodiments, the protective liner layer 170 includes oxide, nitride, or oxynitride. In some embodiments, the protective liner layer 170 may include a material, such as silicon oxinitride (SiON), or the like. However, any suitable material may be utilized.

In some embodiments, the protective liner layer 170 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electro-chemical plating), electroless plating, or the like. The present disclosure is not intended to limit the methods of forming the protective liner layer 170. In some embodiments, the protective liner layer 170 is preferably formed by ALD process.

In some embodiments, the protective liner layer 170 is formed by blanket deposition process. The present disclosure is not intended to limit the methods of forming the protective liner layer 170.

In step S104, the first nitride layer 120 is punched through and the landing pad 110 is exposed.

Figure 4:
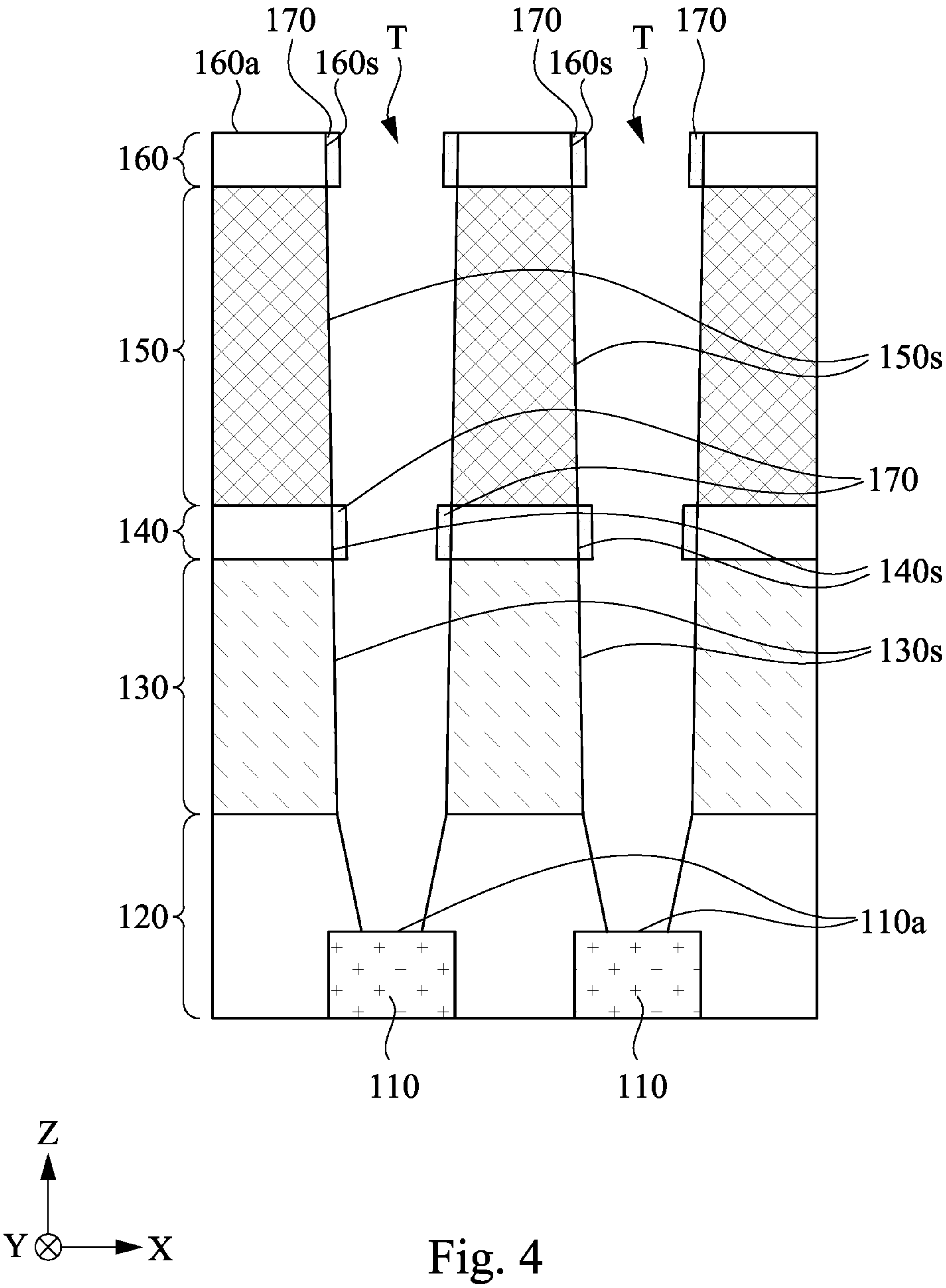
FIG. 4 is a cross-sectional view of an intermediate stage of manufacturing the semiconductor device in accordance with an embodiment of the present disclosure.

Reference is made to FIG. 1 and FIG. 4. FIG. 4 is a cross-sectional view of an intermediate stage of manufacturing the semiconductor device 100 in accordance with an embodiment of the present disclosure. As shown in FIG. 4, in this embodiment, the first nitride layer 120 is punched through such that the landing pad 110 is exposed. As shown in FIG. 4, the landing pad 110 has a top surface 110*a*. In some embodiments, the first nitride layer 120 is etched by the trench T such that the top surface 110*a* of the landing pad 110 is exposed. In some embodiments, step S104 is performed such that a portion of the protective liner layer 170 on the top surface 120*a* of the first nitride layer 120 is removed. In some embodiments, a portion of the protective liner layer 170 on the top surface 160*a* of the third nitride layer 160 is also removed in step S104, as shown in FIG. 4. In some embodiments, the first nitride layer 120 is punched through such that the trench T communicates the landing pad 110.

As shown in FIG. 4, in some embodiments, step S104 is performed such that a width of the first nitride layer 120 tapers downward from the top surface 120*a* of the first nitride layer 120 to the top surface 110*a* of the landing pad 110.

In some embodiments, the first nitride layer 120 may be punched through by any suitable method, for example, dry etching, or the like. The present disclosure is not intended to limit the methods of punching through the first nitride layer 120.

In some embodiments, the first nitride layer 120 may be punched through by any suitable method, for example, anisotropic etching, or the like. The present disclosure is not intended to limit the methods of punching through the first nitride layer 120.

In some embodiments, the first nitride layer 120 may be punched through by using any suitable etching gas, for example, ammonium ($NH_4$), hydrogen fluoride ($HF_4$), or the like. The present disclosure is not intended to limit the methods of punching through the first nitride layer 120.

In step S105, the first nitride layer 120 is etched and a sidewall of the landing pad 110 is exposed.

Figure 5:
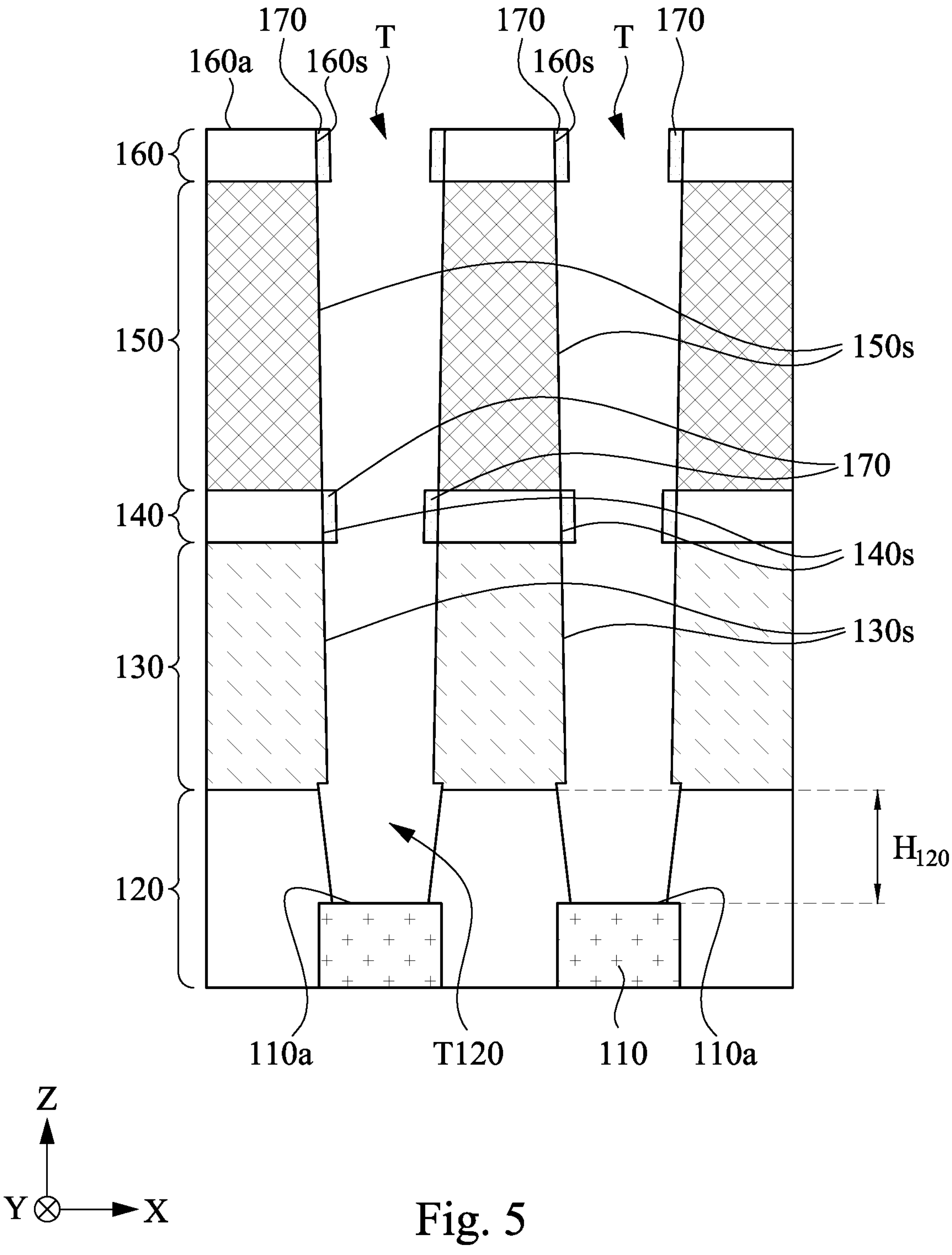
FIG. 5 is a cross-sectional view of an intermediate stage of manufacturing the semiconductor device in accordance with an embodiment of the present disclosure.

Reference is made to FIG. 1 and FIG. 5. FIG. 5 is a cross-sectional view of an intermediate stage of manufacturing a semiconductor device 100 in accordance with an embodiment of the present disclosure. In this embodiment, etching the first nitride layer 120 and exposing the sidewall of the landing pad 110 are performed after punching through the first nitride layer 120 and exposing the landing pad 110. More specifically, the first nitride layer 120 is further consumed after performing step S104. As shown in FIG. 5, in some embodiments, the first nitride layer 120 is etched such that an expanding portion T120 of the trench T is formed. More specifically, the expanding portion T120 is extended from the trench T and runs through the first nitride layer 120. In some embodiments, the expanding portion T120 of the trench T is connected between the top surface 110*a* of the landing pad 110 and the top surface 120*a* of the first nitride layer 120. In some embodiments, the expanding portion T120 is formed such that the sidewall of the landing pad 110 is exposed. As shown in FIG. 5, in step S105, an overall width of the expanding portion T120 is increased with respect to FIG. 4.

In some embodiments, the first nitride layer 120 may be punched through by any suitable method, for example, isotropic etching, or the like. The present disclosure is not intended to limit the methods of forming the trench T.

In some embodiments, the first nitride layer 120 may be etched by using any suitable etching gas, for example, phosphoric acid ($H_3PO_4$), or the like. The present disclosure is not intended to limit the methods of etching the first nitride layer 120.

In some embodiments, a width of a top of the expanding portion T120 of the trench T is greater than a width of a bottom of the expanding portion T120 of the trench T. In some embodiments, a width of the expanding portion T120 of the trench T tapers downward from the top surface 120*a* of the first nitride layer 120 to the top surface 110*a* of the landing pad 110.

In some embodiments, the expanding portion T120 has a height $H_{120}$. In some embodiments, the height $H_{120}$ is defined as a distance from the top surface 120*a* of the first nitride layer 120 to the top surface 110*a* of the landing pad 110. In some embodiments, the height $H_{120}$ is in a range between about 20 nanometers (nm) and about 25 nanometers (nm). In some embodiments in which the distance from the top surface 120*a* to the top surface 110*a* is greater than about 25 nanometers, the top surface 110*a* may not be exposed. In some embodiments in which the distance from the top surface 120*a* to the top surface 110*a* is less than about 20 nanometers, the first nitride layer 120 may be over-etched, so that the leakage problem of capacitors formed in subsequent processes may occur due to seams existing in a portion of the first nitride layer 120 surrounding the landing pad 110.

In step S106, the protective liner layer 170 is removed.

Figure 6:
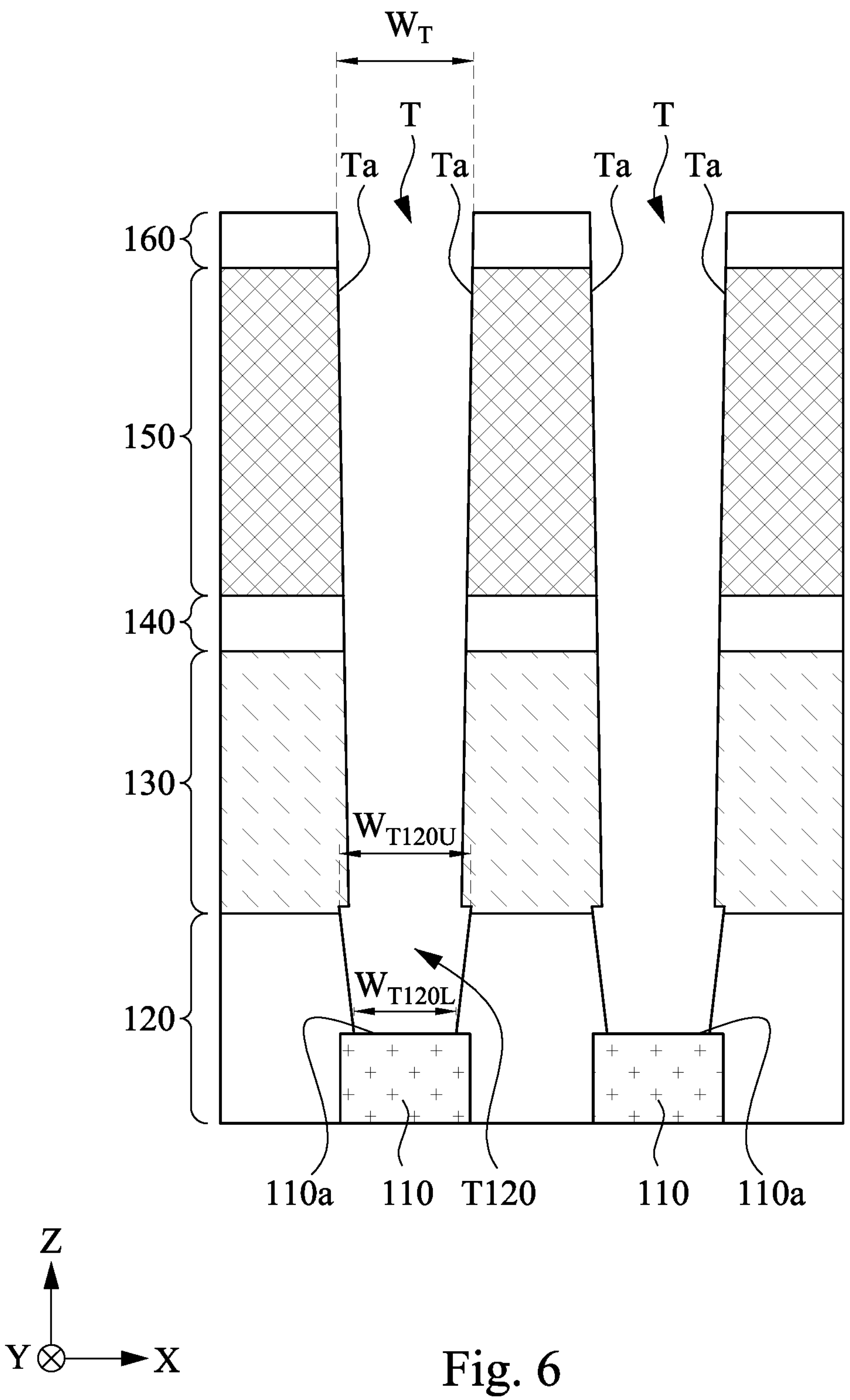
FIG. 6 is a cross-sectional view of an intermediate stage of manufacturing the semiconductor device in accordance with an embodiment of the present disclosure.

Reference is made to FIG. 1 and FIG. 6. FIG. 6 is a cross-sectional view of an intermediate stage of manufacturing a semiconductor device 100 in accordance with an embodiment of the present disclosure. As shown FIG. 6, in this embodiment, the protective liner layer 170 is removed from the inner surface Ta of the trench T. More specifically, the protective liner layer 170 is removed from the side surface 160*s* of the third nitride layer 160 and the side surface 140*s* of the second nitride layer 140. In some embodiments, the protective liner layer 170 is sacrificial, and the protective liner layer 170 is completely removed.

In some embodiments, the protective liner layer 170 may be removed by any suitable method, for example, wet etching, or the like. In some embodiments, the protective liner layer 170 may be removed by using, for example, hydrofluoric acid (HF), or the like. The present disclosure is not intended to limit the methods of forming the protective liner layer 170.

In some embodiments, the protective liner layer 170 may be removed by any suitable method, for example, isotropic etching, or the like. The present disclosure is not intended to limit the methods of forming the protective liner layer 170.

As shown in FIG. 6, in some embodiments, the expanding portion T120 of the trench T has a width $W_{T120U}$ of the top of expanding portion T120 of the trench T and a width $W_{T120L}$ of the bottom of expanding portion T120 of the trench T. More specifically, the width $W_{T120U}$ is defined as a width of the expanding portion T120 extending on the top surface 120*a*, and the width $W_{T120L}$ is defined as a width of the expanding portion T120 extending on the top surface 110*a*. The trench T has a width $W_T$ of a top of the trench T. More specifically, the width $W_T$ is defined as a width of the trench T extending on the top surface 160*a*. In some embodiments, the width $W_{T120U}$ of the top of the expanding portion T120 of the trench T is greater than the width $W_{T120L}$ of the bottom of the expanding portion T120 of the trench T. In some embodiments, the width $W_{T120U}$ of the top of the expanding portion T120 of the trench T is greater than the width $W_T$ of the top of the trench T.

In step S107, an electrode layer 180 is formed.

Figure 7:
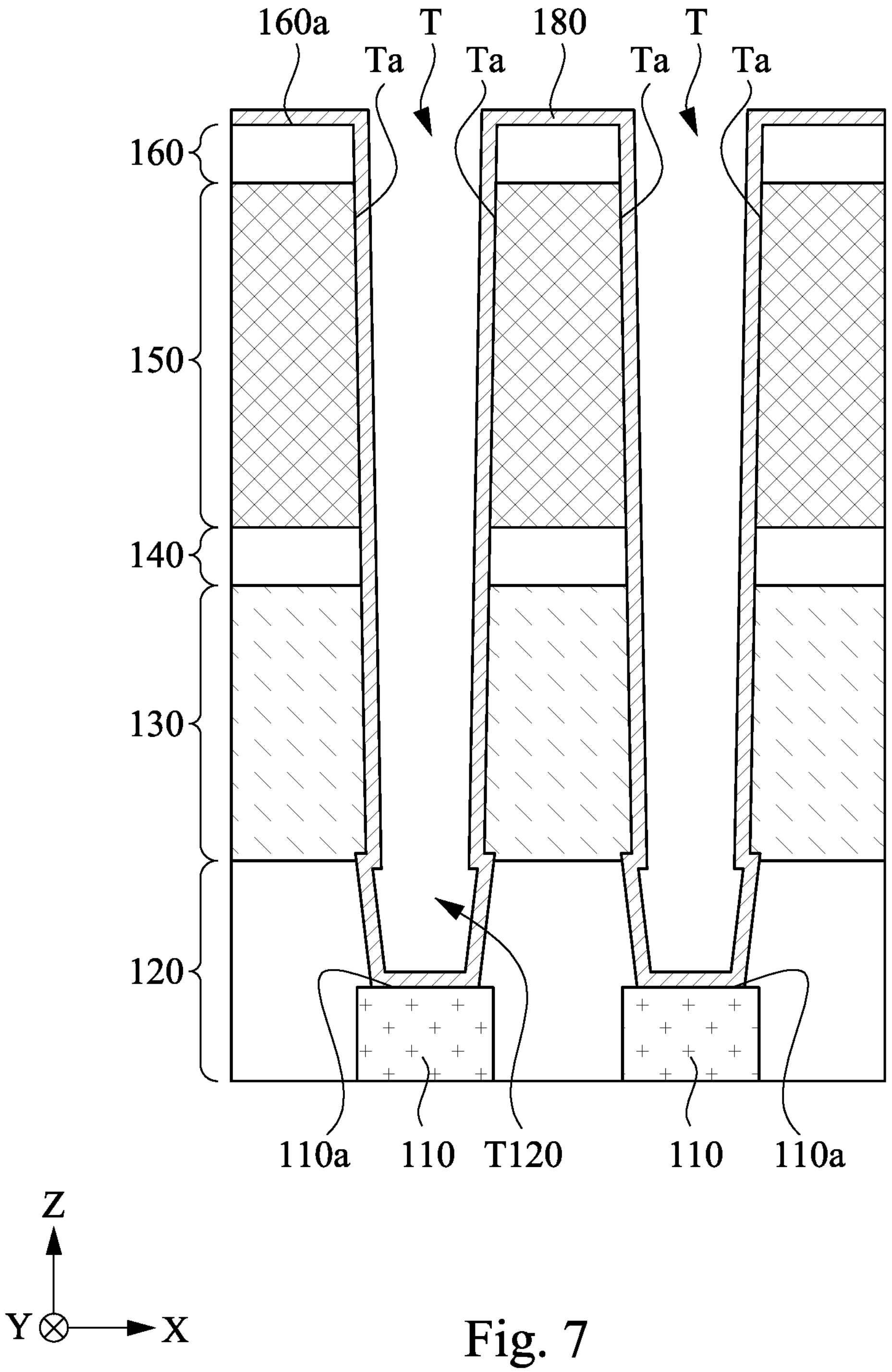
FIG. 7 is a cross-sectional view of an intermediate stage of manufacturing the semiconductor device in accordance with another embodiment of the present disclosure.
Figure 8:
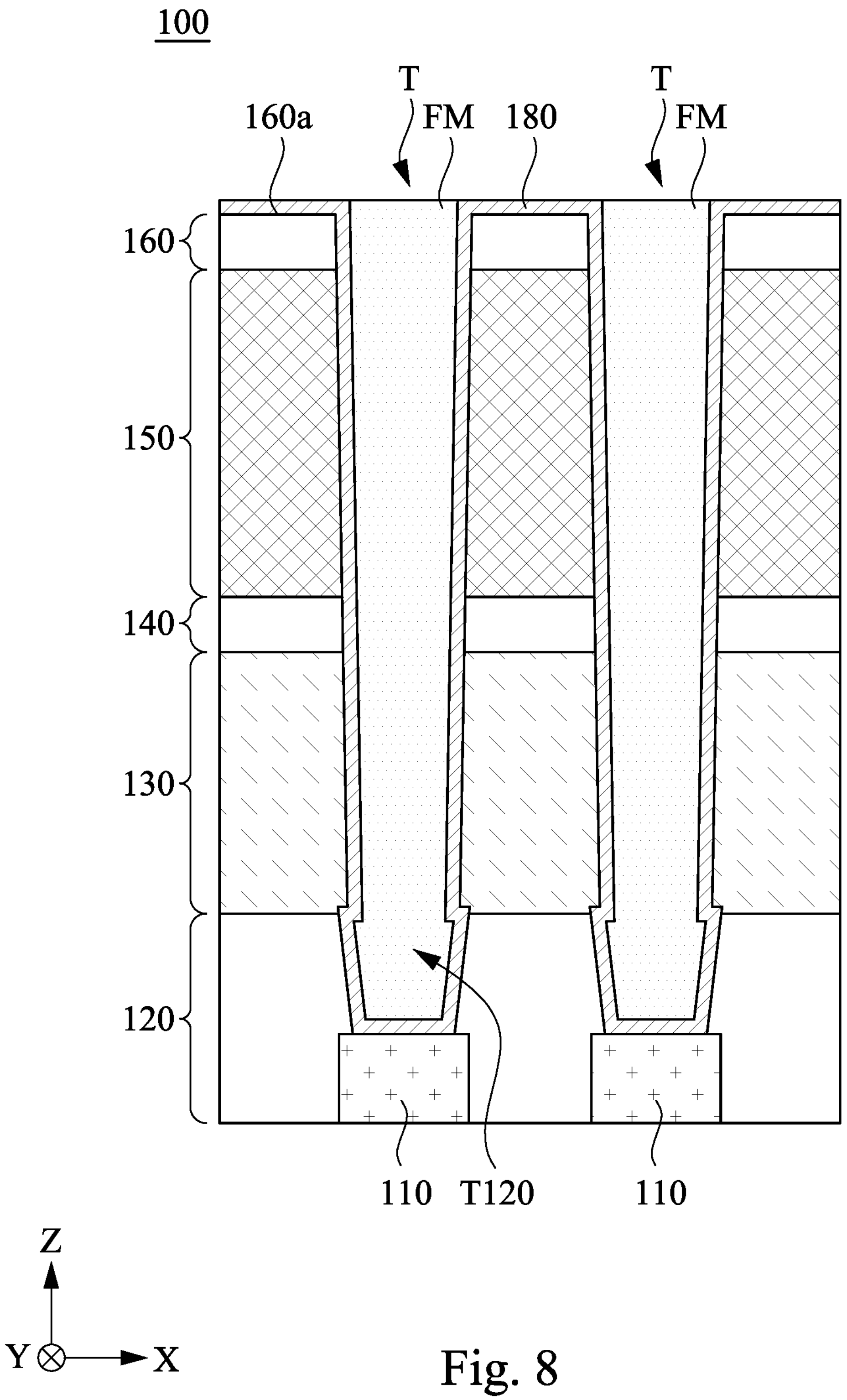
FIG. 8 is a cross-sectional view of an intermediate stage of manufacturing the semiconductor device in accordance with another embodiment of the present disclosure.

Reference is made to FIG. 1 and FIG. 7. FIG. 7 is a cross-sectional view of an intermediate stage of manufacturing a semiconductor device 100 in accordance with an embodiment of the present disclosure. As shown in FIG. 7, in this embodiment, the electrode layer 180 is disposed on the third nitride layer 160. In some embodiments, the electrode layer 180 lines the trench T and the expanding portion T120 of the trench T. In some embodiments, the electrode layer 180 is deposited on the inner surface Ta of the trench T, the top surface 160*a* of the third nitride layer 160, and the expanding portion T120. In some embodiments, since the sidewall of the landing pad 110 is exposed in step S105, the electrode layer 180 is further deposited on the top surface 110*a* and the sidewall of the landing pad 110. In some embodiments, the electrode layer 180 is performed such that the electrode layer 180 contacts the top surface 110*a* and the sidewall of the landing pad 110.

In some embodiments, the electrode layer 180 is configured as a lower electrode of the capacitors.

In some embodiments, the electrode layer 180 includes conductive material. In some embodiments, the electrode layer 180 includes nitride. In some embodiments, the electrode layer 180 may include a material, such as titanium nitride (TiN), or the like. However, any suitable material may be utilized.

In some embodiments, the electrode layer 180 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electro-chemical plating), electroless plating, or the like. The present disclosure is not intended to limit the methods of forming the electrode layer 180. In some embodiments, the electrode layer 180 is preferably formed by CVD process.

In some embodiments, the electrode layer 180 is formed by blanket deposition process. The present disclosure is not intended to limit the methods of forming the electrode layer 180.

In some embodiments, the method M further includes a step of modifying the trench T performed after step S106 and before step S107. More specifically, the trench T may be pulled back, such that the profile of the trench T becomes straighter. Therefore, in some embodiments, the width $W_{T120U}$ of the top of the expanding portion T120 of the trench T is equal to the width $W_T$ of the top of the trench T.

In step S108, a filling material FM is formed.

Reference is made to FIG. 1 and FIG. 8. FIG. 8 is a cross-sectional view of an intermediate stage of manufacturing a semiconductor device 100 in accordance with an embodiment of the present disclosure. As shown in FIG. 8, in this embodiment, the filling material FM is deposited to fill the trench T, such that the semiconductor device 100 is formed. More specifically, the filling material FM fills the trench T and the expanding portion T120 of the trench T. In some embodiments, depositing the filling material FM to fill the trench T is performed such that the filling material FM contacts the landing pad 110. More specifically, depositing the filling material FM to fill the trench T is performed such that the filling material FM contacts the top surface 110*a* and the sidewall of the landing pad 110 by the electrode layer 180.

In some embodiments, the filling material FM is configured as the storage of the capacitors.

In some embodiments, the filling material FM includes conductive material. In some embodiments, the electrode layer 180 includes nitride. In some embodiments, the filling material FM may include a material, such as titanium nitride (TiN), or the like. However, any suitable material may be utilized.

In some embodiments, the filling material FM may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electro-chemical plating), electroless plating, or the like. The present disclosure is not intended to limit the methods of forming the filling material FM.

Figure 9:
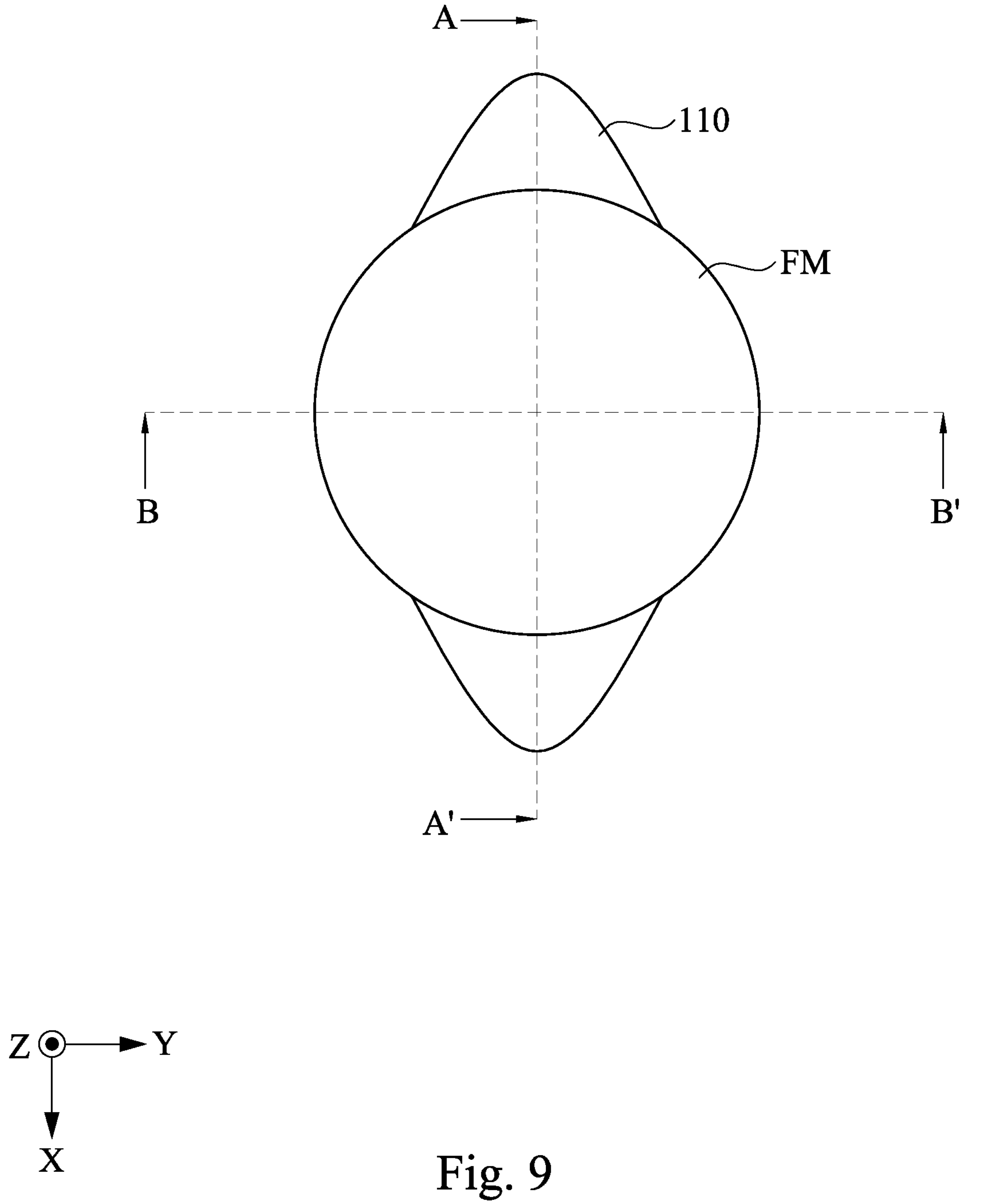
FIG. 9 is a top view of an intermediate stage of manufacturing the semiconductor device in accordance with another embodiment of the present disclosure.

Reference is made to FIG. 1 and FIG. 9. FIG. 9 is a top view of an intermediate stage of manufacturing a semiconductor device 100 in accordance with an embodiment of the present disclosure. To simplify, FIG. 9 merely depicts the landing pad 110, the filling material FM, the section A-A' along x-direction, and the section B-B' along y-direction. As shown in FIG. 9, in this embodiment, the landing pad 110 has a shape of oval or ellipse, and the filling material FM has a shape of circle.

Figure 10:
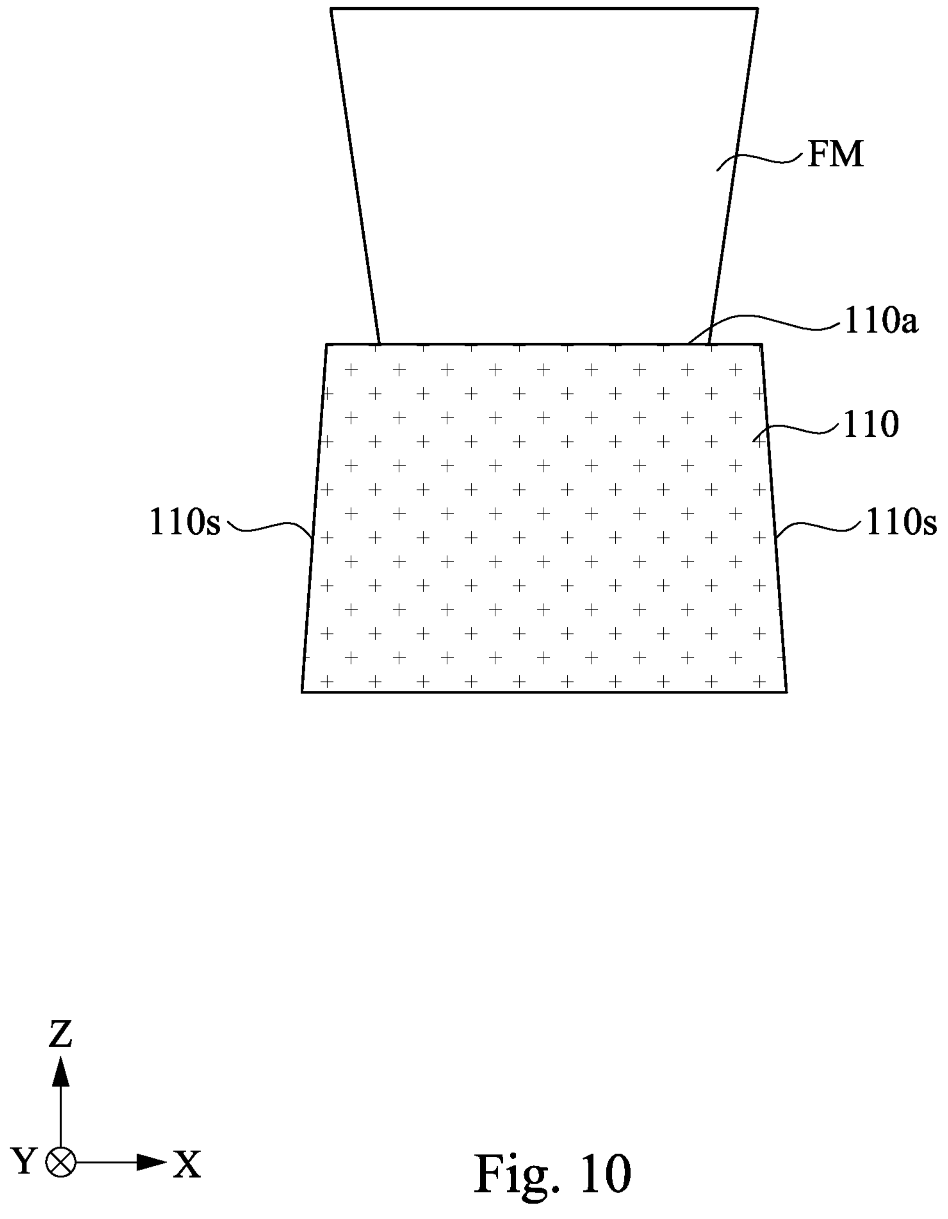
FIG. 10 is a cross-sectional view along a section A-A' shown in FIG. 9 of an intermediate stage of manufacturing the semiconductor device in accordance with another embodiment of the present disclosure.

Reference is made to FIG. 1 and FIG. 10. FIG. 10 is a cross-sectional view along a section A-A' shown in FIG. 9 of an intermediate stage of manufacturing a semiconductor device 100 in accordance with an embodiment of the present disclosure. As shown in FIG. 10, in this embodiment, the filling material FM is located over the landing pad 110. As shown in FIG. 10, the landing pad 110 has a side surface 110*s*. To simplify, the electrode layer 180 is omitted in FIG. 10. In some embodiments, the filling material FM contacts the top surface 110*a* of the landing pad 110 but does not contact the side surface 110*s* of the landing pad 110 along the section A-A' shown in FIG. 9.

Figure 11:
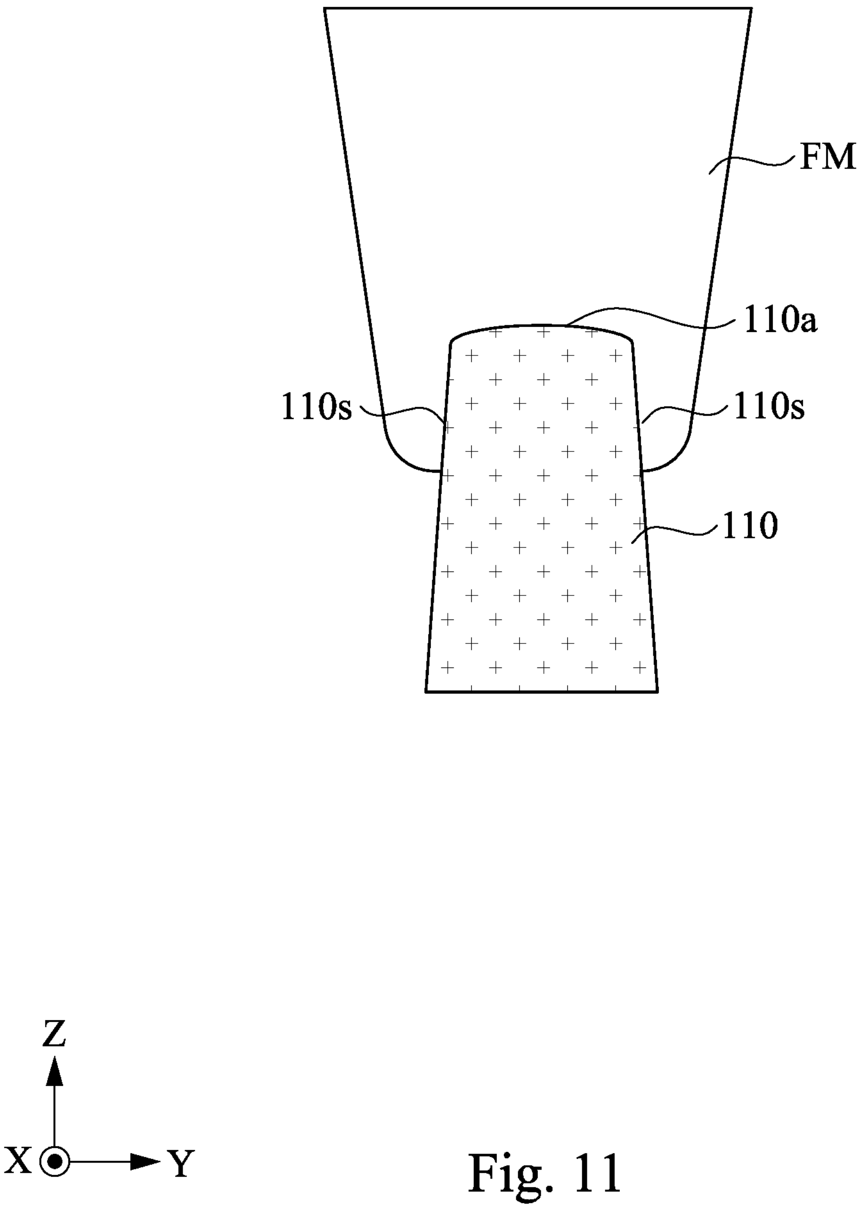
FIG. 11 is a cross-sectional view along a section B-B' shown in FIG. 9 of an intermediate stage of manufacturing the semiconductor device in accordance with another embodiment of the present disclosure.

Reference is made to FIG. 1 and FIG. 11. FIG. 11 is a cross-sectional view along a section B-B' shown in FIG. 9 of an intermediate stage of manufacturing a semiconductor device 100 in accordance with an embodiment of the present disclosure. To simplify, the electrode layer 180 is also omitted in FIG. 11. As shown in FIG. 11, in some embodiments, the filling material FM contacts the top surface 110*a* and the side surface 110*s* of the landing pad 110 along the section B-B' shown in FIG. 9. More specifically, a shape of a structure of the filling material FM contacting the landing pad 110 is similar to a shape of saddle, as shown in FIG. 11. The "saddle contact" of the filling material FM leads to the increase of contact area between the filling material FM and the landing pad 110.

By performing the method M shown in FIG. 1 of the present disclosure, the semiconductor device 100 with better electrical performance may be formed.

Based on the above discussions, it can be seen that in the semiconductor device and the method of manufacturing the same of the present disclosure, since the protective liner layer lines the inner sidewall of the trench, the critical dimension of the trench does not ream after the step of punching the first nitride layer. In the semiconductor device and the method of manufacturing the same of the present disclosure, since merely a portion of the protective liner layer on the top surface of the first nitride layer is removed, only the width of the bottom of the trench increases as the steps of etching the first nitride layer and exposing the sidewall of the landing pad are performed in the semiconductor device and the method of manufacturing the same of the present disclosure, since the trench has the expanding portion when performing the etching the first nitride layer and exposing the sidewall of the landing pad, the contact area between the electrode layer and the landing pad may be increased, thereby lowering the electric resistance between the electrode layer and the landing pad. Overall, the method of manufacturing the semiconductor device of the present disclosure improves the electrical performance of the entire semiconductor device.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing a semiconductor device, comprising:

sequentially forming a landing pad, a first nitride layer, a first oxide layer, a second nitride layer, a second oxide layer, and a third nitride layer;

forming a trench running through the third nitride layer, the second oxide layer, the second nitride layer, and the first oxide layer;

depositing a protective liner layer on surfaces of the first nitride layer, the second nitride layer, and the third nitride layer;

punching through the first nitride layer and exposing the landing pad;

etching the first nitride layer and exposing a sidewall of the landing pad;

removing the protective liner layer;

depositing an electrode layer on an inner surface of the trench and a top surface of the third nitride layer; and depositing a filling material to fill the trench.

2. The method of claim 1, wherein forming the trench is performed such that the first nitride layer is exposed.

3. The method of claim 1, wherein depositing the protective liner layer is performed such that the protective liner layer contacts a top surface of the first nitride layer.

4. The method of claim 1, wherein punching through the first nitride layer and exposing the landing pad are performed such that a portion of the protective liner layer on a top surface of the first nitride layer and a portion of the protective liner layer on a top surface of the third nitride layer are removed.

5. The method of claim 1, wherein etching the first nitride layer and exposing the sidewall of the landing pad are performed after punching through the first nitride layer and exposing the landing pad.

6. The method of claim 1, wherein etching the first nitride layer and exposing the sidewall of the landing pad are performed such that an expanding portion of the trench is formed, and wherein the expanding portion of the trench runs through the first nitride layer.

7. The method of claim 6, wherein etching the first nitride layer and exposing the sidewall of the landing pad are performed such that the expanding portion of the trench is connected between the landing pad and a top surface of the first nitride layer.

8. The method of claim 6, wherein etching the first nitride layer and exposing the sidewall of the landing pad are performed such that a width of a top of the expanding portion of the trench is greater than a width of a bottom of the expanding portion of the trench.

9. The method of claim 8, wherein etching the first nitride layer and exposing the sidewall of the landing pad are performed such that the width of the top of the expanding portion of the trench is equal to or greater than a width of a top of the trench.

10. The method of claim 1, wherein depositing the electrode layer is performed such that the electrode layer contacts a top surface and a sidewall of the landing pad.

11. The method of claim 1, wherein a thickness of the protective liner layer is equal to or greater than 2 nanometers, and wherein the protective liner layer comprises silicon oxynitride.

* * * * *